(12) United States Patent
Sun et al.

(10) Patent No.: US 10,989,933 B2
(45) Date of Patent: Apr. 27, 2021

(54) CONNECTOR, ASSISTIVE DEVICE AND WEARABLE DEVICE

(71) Applicant: NEXTVPU (SHANGHAI) CO., LTD., Shanghai (CN)

(72) Inventors: Chang Sun, Shanghai (CN); Haijiao Cai, Shanghai (CN); Xinpeng Feng, Shanghai (CN); Ji Zhou, Shanghai (CN)

(73) Assignee: NEXTVPU (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 16/842,543

(22) Filed: Apr. 7, 2020

(65) Prior Publication Data

US 2020/0333634 A1    Oct. 22, 2020

Related U.S. Application Data

(63) Continuation of application No. PCT/CN2020/074807, filed on Feb. 12, 2020.

(30) Foreign Application Priority Data

Apr. 18, 2019    (CN) .......................... 201920532150.5

(51) Int. Cl.
   *G02C 1/00*       (2006.01)
   *G02C 11/00*      (2006.01)
   *F16M 13/02*      (2006.01)
   *H05K 5/00*       (2006.01)
   *H01F 7/02*       (2006.01)

(52) U.S. Cl.
   CPC .......... *G02C 11/00* (2013.01); *F16M 13/022* (2013.01); *H01F 7/02* (2013.01); *H05K 5/0086* (2013.01)

(58) Field of Classification Search
   CPC .......... G02C 11/10; G02C 3/04; G02C 11/06; G02C 2200/02; G02C 3/02
   USPC .............. 351/158, 121, 112, 51, 52; 24/303; 362/103
   See application file for complete search history.

(56) References Cited

U.S. PATENT DOCUMENTS

| 9,062,695 B2 | 6/2015 | Witter et al. |
| 9,397,719 B1 | 7/2016 | Schmidt |
| 9,437,969 B2 | 9/2016 | Witter et al. |
| 2014/0267643 A1 | 9/2014 | Wexler et al. |
| 2014/0345090 A1 | 11/2014 | Wang |
| 2015/0261015 A1* | 9/2015 | Han .................. G02B 27/0176 351/158 |
| 2016/0371219 A1 | 12/2016 | Lee et al. |

(Continued)

FOREIGN PATENT DOCUMENTS

| CN | 104216139 A | 12/2014 |
| CN | 204331191 U | 5/2015 |

(Continued)

*Primary Examiner* — Hung X Dang
(74) *Attorney, Agent, or Firm* — Seed IP Law Group LLP (57) ABSTRACT

The present disclosure relates to a connector, an assistive device, a wearable device, and a wearable device kit. The connector includes a first magnetic connecting component; and a second magnetic connecting component detachably connected to the first magnetic connecting component by magnetic attraction. By means of the connector of the present disclosure, the assistive device can be detachably connected to the wearable device more reliably and more flexibly.

20 Claims, 10 Drawing Sheets

(56) References Cited

U.S. PATENT DOCUMENTS

2017/0363885 A1 12/2017 Blum et al.
2019/0024683 A1 1/2019 Franklin

FOREIGN PATENT DOCUMENTS

| | | |
|---|---|---|
| CN | 205430410 U | 8/2016 |
| CN | 205480085 U | 8/2016 |
| CN | 10860558 A | 9/2018 |
| CN | 208369798 U | 1/2019 |
| CN | 209801114 U | 12/2019 |
| EP | 2927735 A2 | 10/2015 |
| EP | 3 029 543 A1 | 6/2016 |
| GB | 2472120 A | 1/2011 |
| JP | 7-305703 A | 9/1995 |
| JP | P2008-542820 A | 11/2008 |
| JP | P2015-515638 A | 5/2015 |
| JP | P2017-49775 A | 3/2017 |
| JP | P2017-114470 A | 6/2017 |
| JP | P2017-524159 A | 8/2017 |
| JP | P2018-121365 A | 8/2018 |
| WO | 2010/067758 A1 | 6/2010 |
| WO | 2013/123264 A1 | 8/2013 |

\* cited by examiner

CONNECTOR, ASSISTIVE DEVICE AND WEARABLE DEVICE

CROSS-REFERENCE TO RELATED APPLICATIONS

This application is a continuation of International Application No. PCT/CN2020/074807, filed on Feb. 12, 2020, which claims priority to Chinese Patent Application No. 201920532150.5, filed on Apr. 18, 2019, the disclosures of which are hereby incorporated by reference in their entireties.

TECHNICAL FIELD

The present disclosure relates to a wearable device and an assistive device.

BACKGROUND ART

Wearable device usually refers to a portable device that may be directly worn by a user or is integrated with clothing or a wearable object to be worn by a user. Currently, the most common wearable devices are glasses, helmets, watches, wristbands, earphones, etc.

There may be generally two types of wearable devices according to the implementation of wearable devices, i.e., a type, simply referred to as an integrated type, in which a device that performs smart functions is integrated in clothing or a wearable object that may be worn by a user, and a type, simply referred to as an assembled type, in which a device that implements smart functions is attached, in the form of an accessory, to clothing or a wearable object. The integrated type is advantageous in terms of performance, appearance, user experience, etc., but has a complex manufacturing process and high cost; and although the assembled type is inferior to the integrated type in the terms of performance, appearance, user experience, etc., it can be easily implemented and is less expensive.

For the assembled type, at present, the most common is to install a small assistive device, such as a smart camera or a smart reader, onto a conventional spectacle frame (i.e., a spectacle frame without smart functions). For example, the small assistive device can be installed to a connector on the spectacle frame by magnetic attraction. In order to ensure the reliable magnetic attraction, a relatively strong magnetic force is usually required, and accordingly the volume and weight of the assistive device and the connector are relatively large, thus affecting the user experience. Particularly, when the user does some exercise, the assistive device tends to fall off due to the vibration generated by the exercise.

The methods described in this section are not necessarily the methods that have been previously conceived or employed. Unless otherwise specified, it should not be assumed that any method described in this section is considered as the prior art just because it is included in this section. Similarly, unless otherwise specified, the problems mentioned in this section should not be considered to be well known in any prior art.

BRIEF SUMMARY

The present disclosure relates to a connector for installing an assistive device to a wearable device an assistive device comprising the connector, a wearable device comprising the connector, and a wearable device kit comprising the connector The present disclosure provides a connector for installing an assistive device to a wearable device. The assistive device may comprise, for example, an electronic device such as a smart camera or a smart reader that can be configured to implement smart functions. The wearable device may comprise a spectacle frame, etc. By using the connector, it is possible to ensure that the assistive device is reliably and detachably connected to the wearable device, thereby reducing the risk of the assistive device falling off from the wearable device in a vibration environment (for example, during the exercise of a user wearing the wearable device).

It should be understood that term "wearable device" used herein may be a wearable device that has an intelligent function such as image recognition, voice broadcast and the like, and may be a wearable device that has no intelligent function, such a conventional spectacle frame, a conventional helmet and the like. Connector according to the present disclosure may be coupled to the body of the wearable device, hereinafter, referred to as wearable body, and the wearable body may be a housing, a frame and the like, or a portion thereof, of the wearable device of any type that can be coupled to the assistive device.

To this end, according to a first aspect of the present disclosure, the present disclosure provides a connector for installing an assistive device to a wearable device, the connector comprising: a first magnetic connecting component; and a second magnetic connecting component detachably connected to the first magnetic connecting component by magnetic attraction.

According to the first aspect, in some embodiments, the connector further comprises a locking component, wherein when the first magnetic connecting component and the second magnetic connecting component are connected to each other by attraction, the locking component can prevent, by means of the form-fit with the second magnetic connecting component, the second magnetic connecting component from moving relative to the first magnetic connecting component in at least one direction perpendicular to the direction of magnetic attraction. By means of preventing the second magnetic connecting component from moving relative to the first magnetic connecting component in the at least one direction perpendicular to the direction of magnetic attraction, it is possible to effectively reduce the possibility of reduced effective magnetic attraction area between the first magnetic connecting component and the second magnetic connecting component that are connected by magnetic attraction, thereby reducing the risk of the assistive device falling off from the wearable device. In some embodiments, when the wearable device is in a wearing state, the at least one direction includes the direction of gravity, such that it is possible to reduce the possibility of the assistive device being separated from the wearable device due to strenuous exercise.

According to the first aspect described above, in some embodiments, the locking component only allows, by means of form-fit with the second magnetic connecting component, the second magnetic connecting component to move a first distance in a direction parallel to the direction of magnetic attraction. Therefore, it is possible to ensure that the effective magnetic attraction area between the first magnetic connecting component and the second magnetic connecting component that are connected by magnetic attraction is always the largest, thereby further reducing the risk of the assistive device falling off from the wearable device.

As a result, the connector of the present disclosure can effectively reduce the possibility of reduced effective magnetic attraction area between the first magnetic connecting component and the second magnetic connecting component that are connected by magnetic attraction. Therefore, a smaller, lighter, thinner magnetic component can be used, thereby reducing the weight and thickness of the connector. For a wearable device such as a spectacle frame, the reduction in the weight and/or thickness can significantly improve the appearance and comfort of a wearer.

According to the first aspect described above, in some embodiments, the locking component comprises a tongue, the second magnetic connecting component comprises a locking groove that can accommodate the tongue, and the tongue can move the first distance in the locking groove in a direction parallel to the direction of magnetic attraction.

According to the first aspect described above, in some embodiments, the second magnetic connecting component comprises a clamping groove used for clamping a portion of the wearable device such that the second magnetic connecting component is detachably connected to the wearable device.

According to the first aspect described above, in some embodiments, the second magnetic connecting component has a recess that accommodates at least a portion of the first magnetic connecting component in a form-fit manner, with the depth of the first magnetic connecting component entering the recess in the direction of magnetic attraction being less than the first distance.

According to the first aspect described above, in some embodiments, the first magnetic connecting component is provided with a beveled portion at a lateral portion thereof near the locking component, such that the second magnetic connecting component can move along the beveled portion in a direction away from the locking component while moving away from the first magnetic connecting component against magnetic attraction. By providing this beveled portion, the first distance can be reduced, so as to reduce the thickness of the connector in the direction of magnetic attraction and therefore reduce the weight. As discussed above, for the wearable device, in particular for a spectacle frame, the reduction in the weight and thickness can significantly improve the appearance and the comfort of a wearer.

According to the first aspect described above, in some embodiments, the first magnetic connecting component has at least one convex pin extending parallel to the direction of magnetic attraction, and the second magnetic connecting component has a convex pin accommodating portion for accommodating the at least one convex pin, with the depth of the convex pin entering the convex pin accommodating portion in the direction of magnetic attraction being less than the first distance.

According to the first aspect described above, in some embodiments, the first magnetic connecting component and the second magnetic connecting component comprise at least one pair of permanent magnets having opposite polarities. For example, the first magnetic connecting component and the second magnetic connecting component may comprise at least two pairs of spaced permanent magnets.

According to the first aspect described above, in some embodiments, the first magnetic connecting component and the locking component are detachably connected to the assistive device or integrated with the assistive device. For example, the first magnetic connecting component and the locking component can be separately manufactured and are connected to the assistive device by means of an adhesive, a fastener, etc., or the first magnetic connecting component and the locking component are a portion of a housing of the assistive device.

According to the first aspect described above, in some embodiments, the first magnetic connecting component is integrated with the assistive device by means of injection molding.

According to the first aspect described above, in some embodiments, it is characterized in that the second magnetic connecting component is detachably connected to the wearable device or integrated with the wearable device. For example, the second magnetic connecting component can be fixed to the wearable device by means of an adhesive, a fastener, etc., or the second magnetic connecting component is a portion of the wearable device.

According to the first aspect described above, in some embodiments, the second magnetic connecting component is integrated with the wearable device by means of injection molding.

According to the first aspect described above, in some embodiments, the first magnetic connecting component can rotate relative to the second magnetic connecting component by a predetermined angle.

According to the first aspect described above, in some embodiments, the first magnetic connecting component can be, relative to the second magnetic connecting component, in at least a first position where the first magnetic connecting component and the second magnetic connecting component form a first angle, and a second position where the first magnetic connecting component and the second magnetic connecting component form a second angle different from the first angle.

According to the first aspect described above, in some embodiments, the clamping groove has a first lateral face, a second lateral face, and a connecting surface connecting the first lateral face and the second lateral face, and the connecting surface and a longitudinal axis of the second magnetic connecting component form a predetermined tilt angle. As will be described below in detail, such a configuration can significantly increase an effective image area that can be recognized by the assistive device, thereby greatly improving the utilization of the angle of field of view.

According to the first aspect described above, in some embodiments, the predetermined tilt angle is between 10 degrees and 20 degrees, and is in some embodiments 15 degrees. For example, when the assistive device is tilted 15 degrees downward relative to a temple of a spectacle frame, the effective image area will increase by 20%.

According to a second aspect of the present disclosure, an assistive device is provided. The assistive device comprises the connector described above. As a result, users can purchase the assistive device and install it onto various wearable devices by themselves.

According to the second aspect described above, in some embodiments, a longitudinal axis of the connector and a longitudinal axis of the assistive device form a predetermined tilt angle.

According to a third aspect of the present disclosure, a wearable device is provided. The wearable device comprises the connector described above. As a result, after purchasing the wearable device, users can install various assistive devices, such as an electronic reader and a smart camera, onto the wearable device.

According to the third aspect described above, in some embodiments, a longitudinal axis of the connector and a longitudinal axis of the wearable device form a predetermined tilt angle.

According to a fourth aspect of the present disclosure, a wearable device kit is provided. The wearable device kit comprises an assistive device and a wearable device, and further comprises the connector described above.

According to the fourth aspect described above, in some embodiments, the wearable device is a spectacle frame, and the assistive device is an electronic reader.

According to the fourth aspect described above, in some embodiments, when the first magnetic connecting component and the second magnetic connecting component are connected to each other by attraction to install the assistive device to the wearable device, a longitudinal axis of the assistive device and a portion, connected to the second magnetic connecting component, of the wearable device form a predetermined tilt angle.

According to the fourth aspect described above, in some embodiments, a longitudinal axis of the connector and a longitudinal axis of the assistive device form a predetermined tilt angle.

According to the fourth aspect described above, in some embodiments, a longitudinal axis of the connector and a longitudinal axis of the wearable device form a predetermined tilt angle.

BRIEF DESCRIPTION OF THE DRAWINGS

Example implementations according to the present disclosure will be described below in detail in conjunction with the accompanying drawings. In the figures.

The drawings illustratively show the embodiments and constitute part of the specification, and are used to illustrate the example implementations of the embodiments together with the text description of the specification. The embodiments shown are for illustration purposes only, but do not limit the scope of protection of the claims. Throughout the drawings, the same reference numerals refer to the same or similar elements.

DETAILED DESCRIPTION OF EMBODIMENTS

In the present disclosure, unless otherwise stated, the use of terms "first," "second," etc., to describe various elements is not intended to limit the positional relationship, temporal relationship or importance relationship of these elements, and such terms are only used to distinguish one element from another. In some examples, the first element and the second element may refer to the same example of the element, and in some cases, based on contextual descriptions, they may also refer to different examples.

The terms used in the description of the various examples in the present disclosure are merely for the purpose of describing particular examples, and are not intended to be limiting. Unless otherwise specified explicitly in the context, if the number of element is not specifically limited, this element may be one or more elements. Moreover, the term "and/or" used in the present disclosure encompasses any one of the items listed and all possible combinations.

It should be noted that although the background art and a connector used to install a wearable device onto an assistive device are illustrated herein with a conventional spectacle frame being used as the wearable device and a smart camera/electronic reader used as the assistive device as an example, the present disclosure is not limited thereto. For example, the wearable device may be a wearable apparatus having smart functions including a smart spectacle frame, and the assistive device may be an accessory without smart functions. The connector of the present disclosure can be applicable, as long as it is for a wearable device and an assistive device that can be used in combination (or need to be used in combination) and need to be installed or detached for repeated use.

Figure 1:
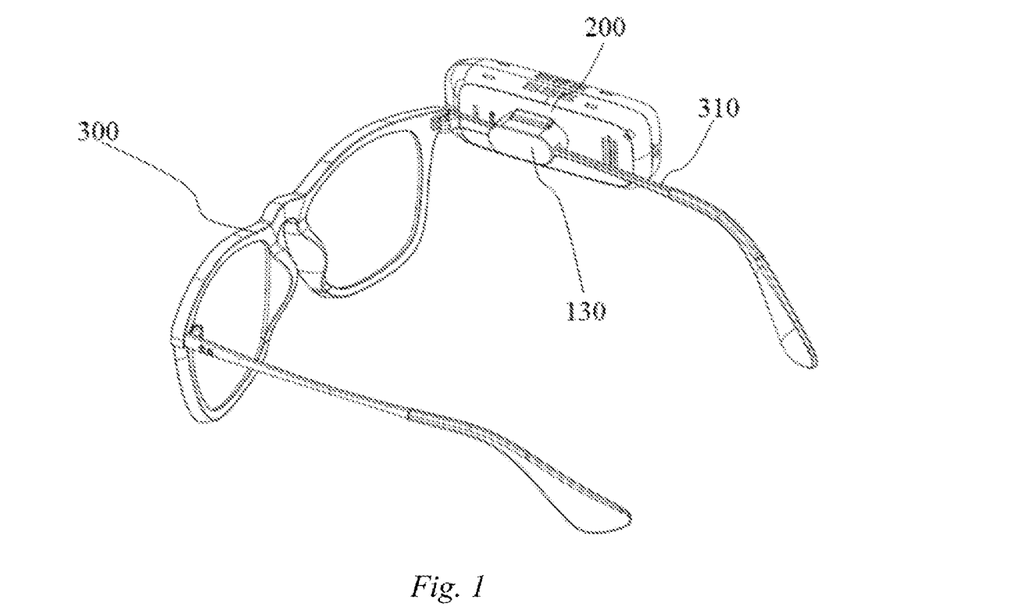
FIG. 1 is a schematic diagram of an assistive device being connected to a spectacle frame used as an example of a wearable device by means of a connector according to a first example embodiment of the present disclosure.

A connector 100 according to a first example embodiment of the present disclosure will be described below with reference to FIGS. 1 to 9. As shown in FIG. 1, the connector 100 is configured to detachably connect an assistive device 200 to a spectacle frame 300 which is used as a possible example of a wearable device.

Figure 4:
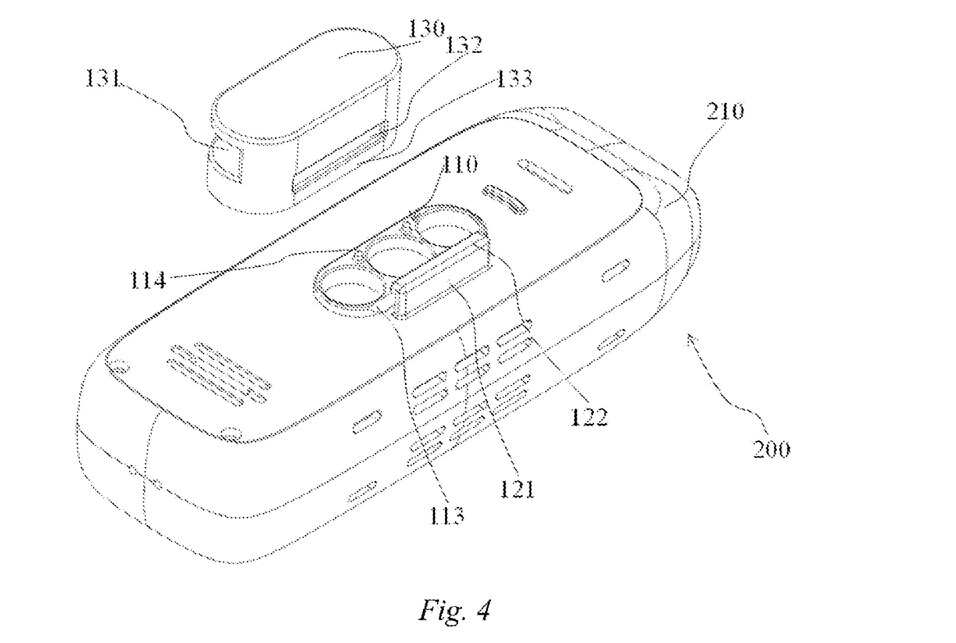
FIG. 4 is an exploded perspective view of the connector shown in FIG. 2, with a permanent magnet of a first magnetic connecting component being omitted.

The connector 100 according to the present disclosure comprises a first magnetic connecting component 110, a locking component 120, and a second magnetic connecting component 130. As shown in FIG. 4, in an example embodiment of the present disclosure, the first magnetic connecting component 110, the locking component 120, and the assistive device 200 are integrated by means of injection molding. That is, the first magnetic connecting component 110 and the locking component 120 are a portion of a housing 210 of the assistive device 200.

As shown in FIG. 1, a temple 310 of the spectacle frame 300 is clamped in a U-shaped groove 131 (a clamping groove) of the second magnetic connecting component 130. The temple 310 may be arranged in interference-fit in the U-shaped groove 131. As a result, the second magnetic connecting component 130 can be fastened to the temple of the spectacle frame 300 without an additional fastening measure (for example, an adhesive, a screw, etc.). It should be understood that, as another example implementation, the second magnetic connecting component 130 may be adhered to the temple of the spectacle frame 300 by means of an adhesive, or the second magnetic connecting component 130 may be directly formed on the temple 310 by means of injection molding. In addition, the second magnetic connecting component 130 may also be fixed to another position of the spectacle frame 300 or integrally formed at another position.

It should be understood that, instead of being integrated with the assistive device 200, the first magnetic connecting component 110 and the locking component 120 of the present disclosure may be fixed to the housing 210 of the assistive device 200 by an adhesive or various fasteners, for example.

Figure 5:
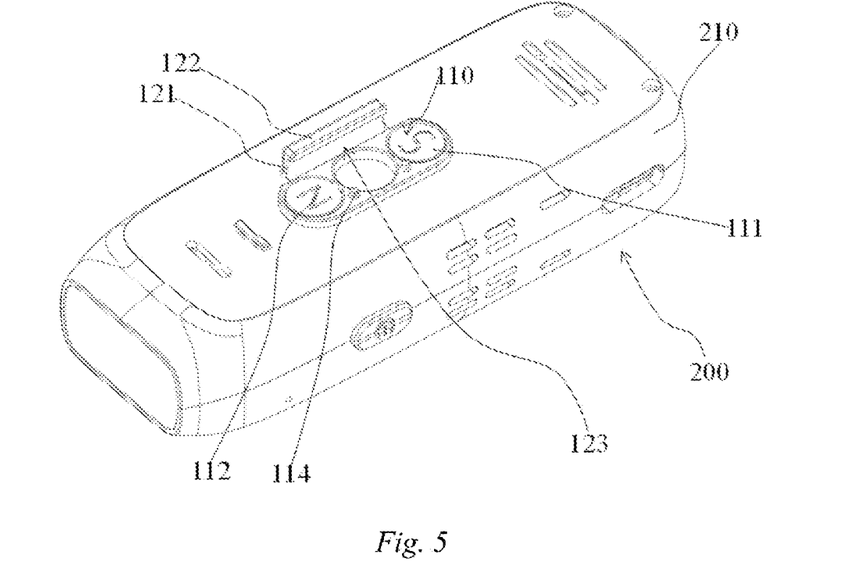
FIG. 5 is a schematic perspective view of the assistive device shown in FIG. 2, with a first magnetic connecting component and a locking component being integrated with a housing of the assistive device, showing two permanent magnets spaced apart and having opposite polarities of the first magnetic connecting component.
Figure 6:
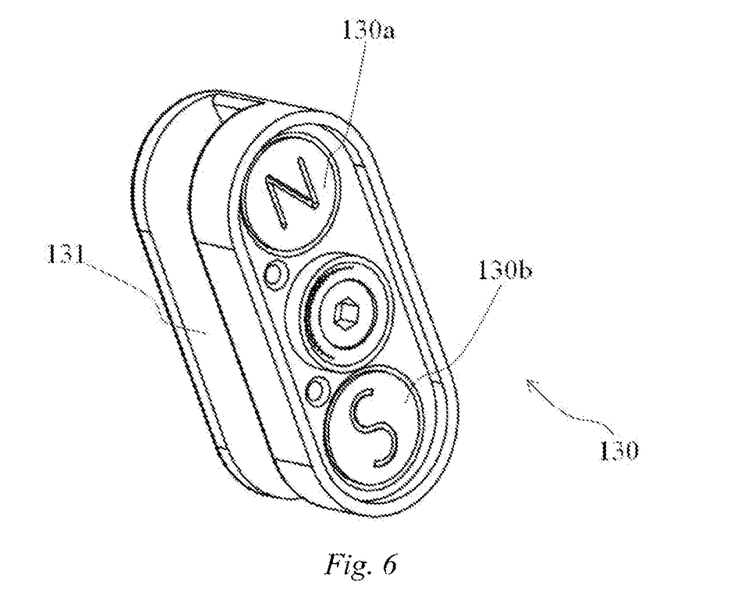
FIG. 6 is a perspective view of a second magnetic connecting component, showing two permanent magnets spaced apart and having opposite polarities of the second magnetic connecting component.
Figure 7:
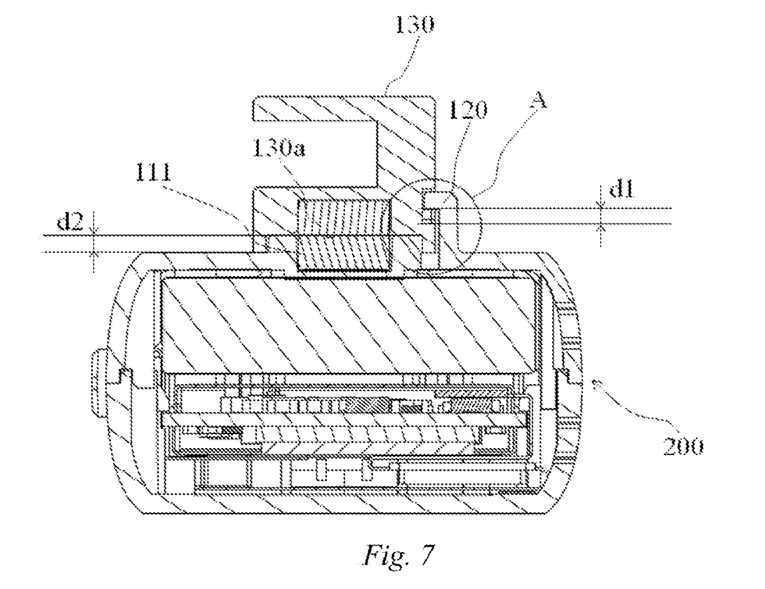
FIG. 7 is a sectional view of a permanent magnet passing through a first magnetic connecting component in FIG. 2.

As shown in FIGS. 5 and 7, the first magnetic connecting component 110 is provided with a pair of permanent magnets 111 and 112 spaced apart and having opposite polarities (for example, the permanent magnet 111 is an S-pole magnet, and the permanent magnet 112 is an N-pole magnet), which are configured to implement a connection by attraction with a pair of permanent magnets 130a and 130b (see FIG. 6), spaced apart and having opposite polarities, correspondingly arranged on the second magnetic connecting component 130. The permanent magnets spaced apart and having opposite polarities can further prevent the assistive device from rotating around the direction of magnetic attraction while ensuring a sufficient force of magnetic attraction, and can prevent the assistive device 200 from being installed on the spectacle frame 300 in an incorrect orientation as compared with the case where the first magnetic connecting component 110 and the second magnetic connecting component 130 are respectively provided with a pair of magnets having the same polarity (for example, the first magnetic connecting component 110 has two S-pole magnets, and the second magnetic connecting component 130 has two N-pole magnets). The reason is that, because the first magnetic connecting component 110 has one S-pole magnet and one N-pole magnet and the second magnetic connecting component 130 correspondingly has one N-pole magnet and one S-pole magnet, when the assistive device 200 with the first magnetic connecting component 110 is installed onto the spectacle frame 300 with the second magnetic connecting component 130 in a correct orientation, the S-pole magnet of the first magnetic connecting component 110 is magnetically attracted to the N-pole magnet of the second magnetic connecting component 130, and the N-pole magnet of the first magnetic connecting component 110 is magnetically attracted to the S-pole magnet of the second magnetic connecting component 130; and when the assistive device 200 with the first magnetic connecting component 110 is installed onto the spectacle frame 300 with the second magnetic connecting component 130 in an incorrect orientation (for example, the assistive device rotates by 180 degrees), the S-pole magnet of the first magnetic connecting component 110 faces the S-pole magnet of the second magnetic connecting component 130, and the N-pole magnet of the first magnetic connecting component 110 faces the N-pole magnet of the second magnetic connecting component 130, such that the first magnetic connecting component 110 and the second magnetic connecting component 130 repel each other so as to prompt a user that the installation direction is incorrect. As for an assistive device such as a smart camera or an electronic reader, the incorrect installation direction will cause it to fail to work correctly. Therefore, it is beneficial for the visually impaired to prevent an installation direction error and provide a perceptible prompt when an installation direction error occurs.

It should be understood that each of the first magnetic connecting component 110 and the second magnetic connecting component 130 may be provided with only one permanent magnet (for example, a non-circular permanent magnet) or more than one pair of permanent magnets.

As shown in FIGS. 4 and 5 and FIGS. 7 and 8, the locking component 120 is in a form of snap connector, which has a first locking portion 121 extending substantially perpendicular to the housing 210 of the assistive device 200 and a second locking portion 122 (a tongue) extending substantially perpendicular to the first locking portion 121 and extending a certain distance above the first magnetic connecting component 110, with a first locking groove 123 being formed between the second locking portion 122 and the housing 210. Correspondingly, the second magnetic connecting component 130 has a second locking groove 132, and the second locking groove 132 is spaced at a certain distance from a surface, connected to the first magnetic connecting component 110, of the second magnetic connecting component 130, thereby forming a third locking portion 133.

Figure 2:
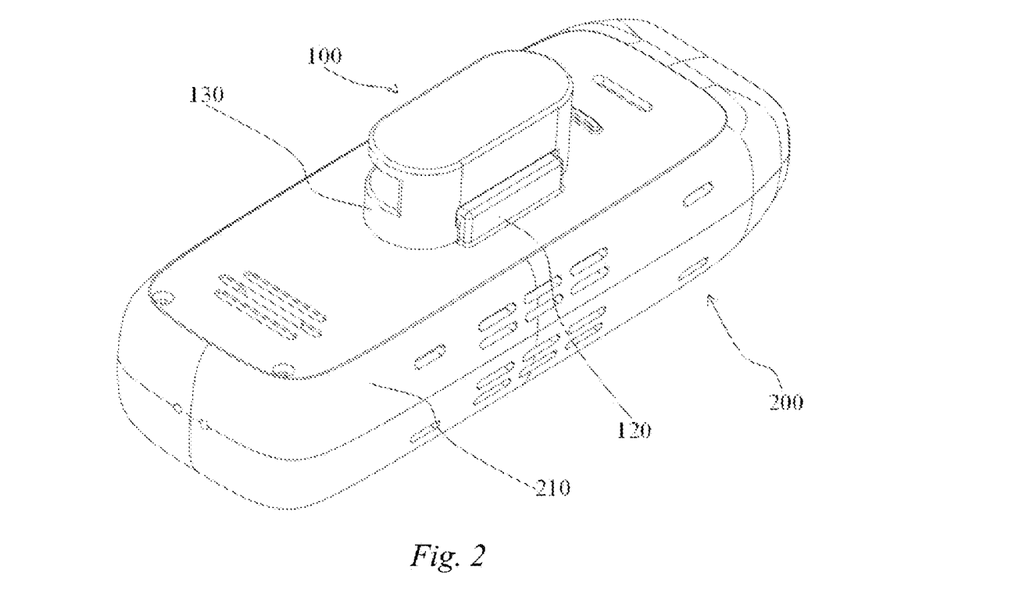
FIG. 2 is a schematic perspective view of a connector used for connecting an assistive device to a wearable device according to the present disclosure, with the connector being in a state of being connected to the assistive device.
Figure 3:
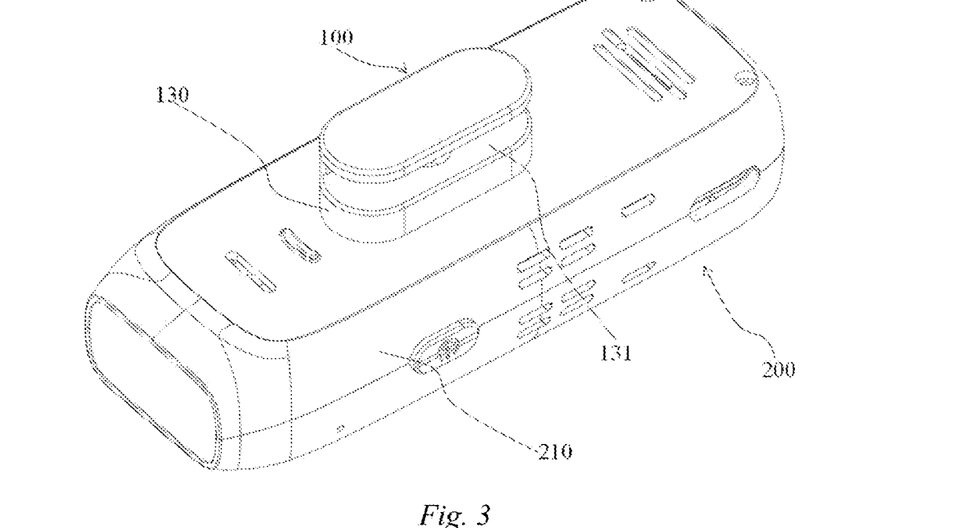
FIG. 3 is a schematic perspective view of the connector shown in FIG. 2 from another angle.
Figure 8:
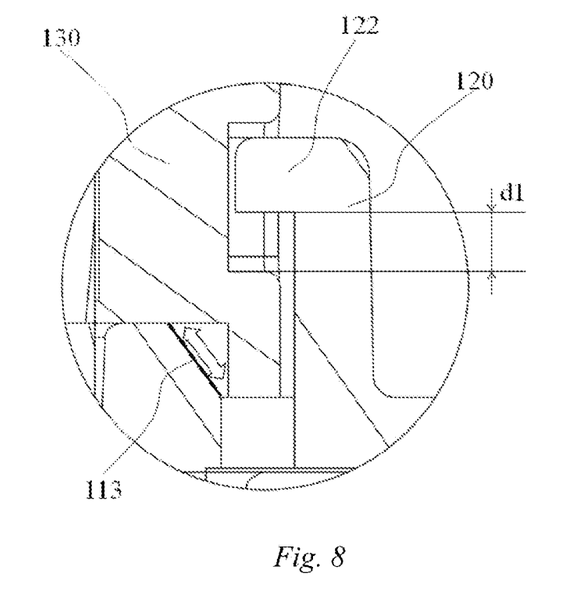
FIG. 8 is a partial enlarged view of a portion A in FIG. 7, showing a beveled portion in detail.

As shown in FIGS. 2, 7 and 8, the second locking portion 122 of the locking component 120 is inserted in the second locking groove 132 of the second magnetic connecting component 130. The third locking portion 133 of the second magnetic connecting component 130 is inserted in the first locking groove 123. By setting the shape and size of the second locking portion 122 of the locking component 120 and the second locking groove 132 of the second magnetic connecting component 130, it is possible to prevent or limit, by means of form-fit, the second magnetic connecting component 130 from moving in at least one direction perpendicular to the direction of magnetic attraction between the first magnetic connecting component 110 and the second magnetic connecting component 130, and in some embodiments prevent or limit the second magnetic connecting component 130 from moving in all directions perpendicular to the direction of magnetic attraction between the first magnetic connecting component 110 and the second magnetic connecting component 130, and only allows the second magnetic connecting component 130 move a first distance d1 against a force of magnetic attraction in a direction parallel to the direction of magnetic attraction. In some embodiments, the first distance d1 is minimized to reduce the overall thickness of the connector 100 after being assembled. For example, the first distance d1 may be any value between 0.5 mm and 5 mm.

Since the movement of the second magnetic connecting component 130 in all directions perpendicular to the direction of magnetic attraction between the first magnetic connecting component 110 and the second magnetic connecting component 130 is prevented or limited, the permanent magnets of the first magnetic connecting component 110 and the second magnetic connecting component 130 always face each other, thereby ensuring that the effective magnetic attraction area is always the largest. Therefore, it is possible to appropriately reduce the volume and thickness of the permanent magnet, and thus reduce the mass of the permanent magnet.

It should be understood that, for the wearable device, it is desirable to minimize the weight and thickness, so as to improve the appearance and the wear comfort. By means of the technical solution described above of the present disclosure, it is possible to effectively reduce the overall thickness and weight of the connector, and thus achieve the beneficial technical effects superior to the prior art.

As shown in FIGS. 5, 7 and 8, the first magnetic connecting component 110 is provided with a protrusion that protrudes from the surface of the housing 210 of the assistive device 200, and correspondingly the second magnetic connecting component 130 is provided, on a surface thereof fitted with the first magnetic connecting component 110, with a recess used to accommodate the protrusion of the first magnetic connecting component 110 in a form-fit manner, thereby obtaining a more reliable connection. In order to facilitate the separating of the second magnetic connecting component 130, in some embodiments, the depth d2 of the protrusion of the first magnetic connecting component 110 entering the recess of the second magnetic connecting component 130 in the direction of magnetic attraction is less than the first distance d1. Therefore, when the second magnetic connecting component 130 moves against a force of magnetic attraction in a direction parallel to the direction of magnetic attraction with the distance of a movement exceeding the depth d2 (less than the first distance d1), the second magnetic connecting component 130 may move away from the first locking portion 121 in a direction that is substantially perpendicular to the direction of magnetic attraction.

As an embodiment, as shown in FIGS. 4, 7, 8 and 9, in some embodiments, the protrusion, protruding from the surface of the housing 210 of the assistive device 200, of the first magnetic connecting component 110 is provided with a beveled portion 113 at a side near the locking component 120. By providing the beveled portion 113, when the first magnetic connecting component 110 and the second magnetic connecting component 130 are separated, the second magnetic connecting component 130 can also move away from the first locking portion 121 in the direction perpendicular to the direction of magnetic attraction (that is, moving along the double-headed arrow in FIG. 8) while moving away from the first magnetic connecting component 110 in the direction of magnetic attraction. By providing the beveled portion 113, the first distance d1 may be less than or equal to the depth d2. By setting the tilt degree of the beveled portion 113 and the depth of the second locking portion 122 entering the second locking groove 132, it is possible to reduce the first distance d1 while ensuring the reliability of connection, thereby reducing the size of the first locking portion 121 extending from the housing 210 substantially perpendicular to the assistive device 200, and thus reducing the thickness of the connector after being assembled.

As described above, for the wearable device, it is desirable to minimize the weight and thickness, so as to improve the appearance and the wear comfort. By means of the example embodiment described above of the present disclosure, it is possible to effectively reduce the overall thickness and weight of the connector, and thus achieve the beneficial technical effects superior to the prior art.

Figure 9:
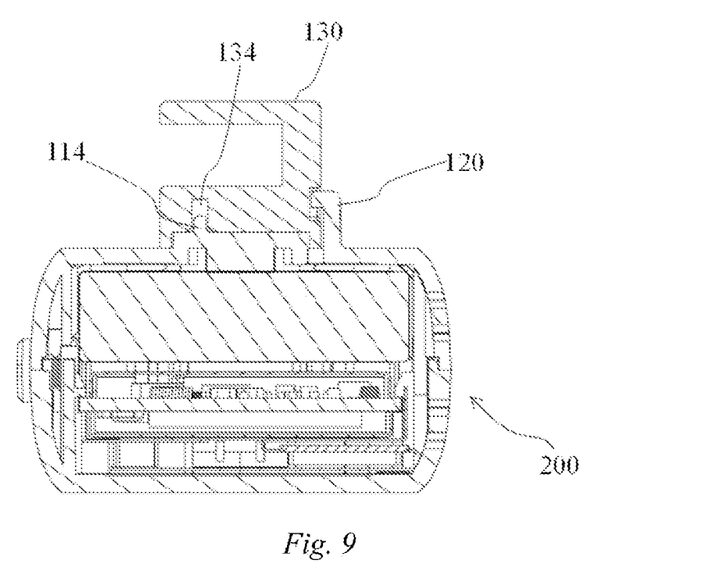
FIG. 9 is a sectional view passing through a convex pin of the first magnetic connecting component in FIG. 2.

In addition, as shown in FIGS. 4 and 8, as another example implementation, the surface of the first magnetic connecting component 110 is further provided with at least one and in some embodiments a plurality of convex pins 114 (two convex pins 114 are shown in the figure). The convex pin 114 is accommodated in a convex pin accommodating portion 134 correspondingly arranged in the second magnetic connecting component 130 (as shown in FIG. 9) to further improve the reliability of connection and positioning. It should be understood that, the depth of the convex pin 114 entering the convex pin accommodating portion 134 in the direction of magnetic attraction is less than the first distance d1, and is in some embodiments less than or equal to the depth of the protrusion of the first magnetic connecting component 110 entering the recess of the second magnetic connecting component 130 in the direction of magnetic attraction.

A method of using the connector 100 according to the present disclosure is not limited to the method in the figure. That is, the first magnetic connecting component 110 and the locking component 120 are integrated with the assistive device 200, while the second magnetic connecting component 130 is detachably installed to the spectacle frame 300.

For example, the connector 100 according to the present disclosure may be sold independently from the assistive device 200 that needs to be installed and the spectacle frame 300. After a consumer purchases the connector 100, the first magnetic connecting component 110 and the locking component 120 are fixed to one of the assistive device 200 and the spectacle frame 300 by means of an adhesive, a fastener (for example, a screw, a bolt, etc.) or the like, and the second magnetic connecting component 130 is fixed to the other of the assistive device 200 and the spectacle frame 300. As a result, the assistive device 200 and the spectacle frame 300 can be flexibly and reliably connected, and the assistive device 200 can be prevented from being installed to the spectacle frame 300 in an incorrect orientation.

In addition, the second magnetic connecting component 130 of the connector 100 according to the present disclosure may also be integrated with the wearable device (for example, the spectacle frame 300), for example, integrated with the wearable device (for example, the spectacle frame 300) by means of injection molding.

Figure 10:
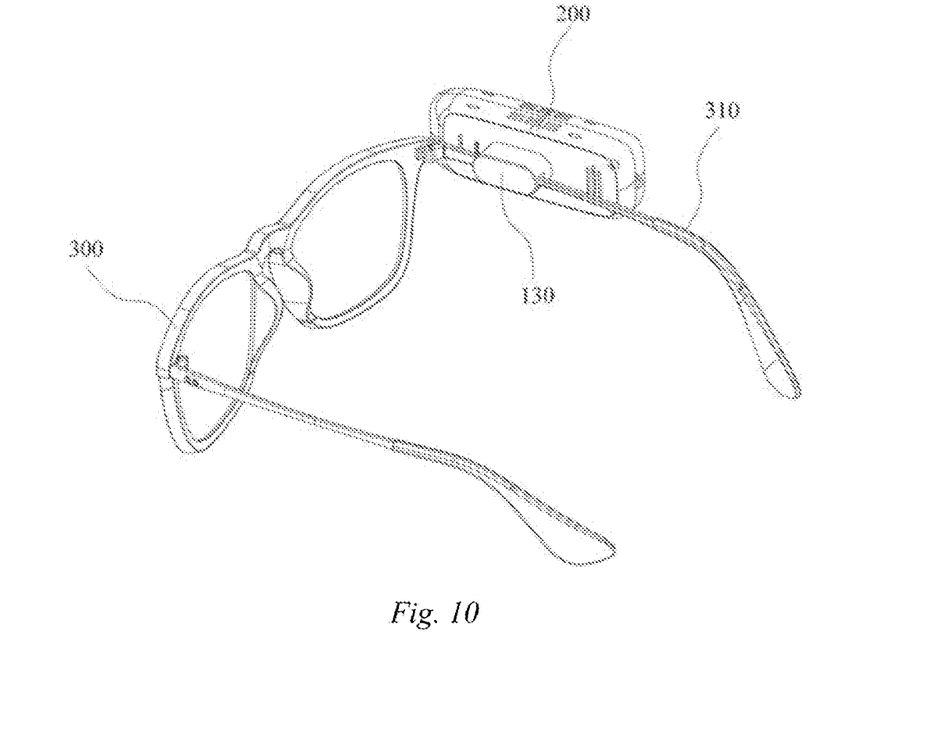
FIG. 10 shows a second example embodiment according to the present disclosure, which is different from the first example embodiment only in that a locking component is omitted.

It should be understood that the connector 100 according to the first example embodiment of the present disclosure may not have the locking component 120. FIG. 10 shows a second example embodiment of the present disclosure, which is different from the first example embodiment only in that the locking component 120 is omitted. Since the remaining structure in the second example embodiment shown in FIG. 10 is identical to that in the first example embodiment shown in FIGS. 1 to 9, it will not be described herein again.

Figure 11:
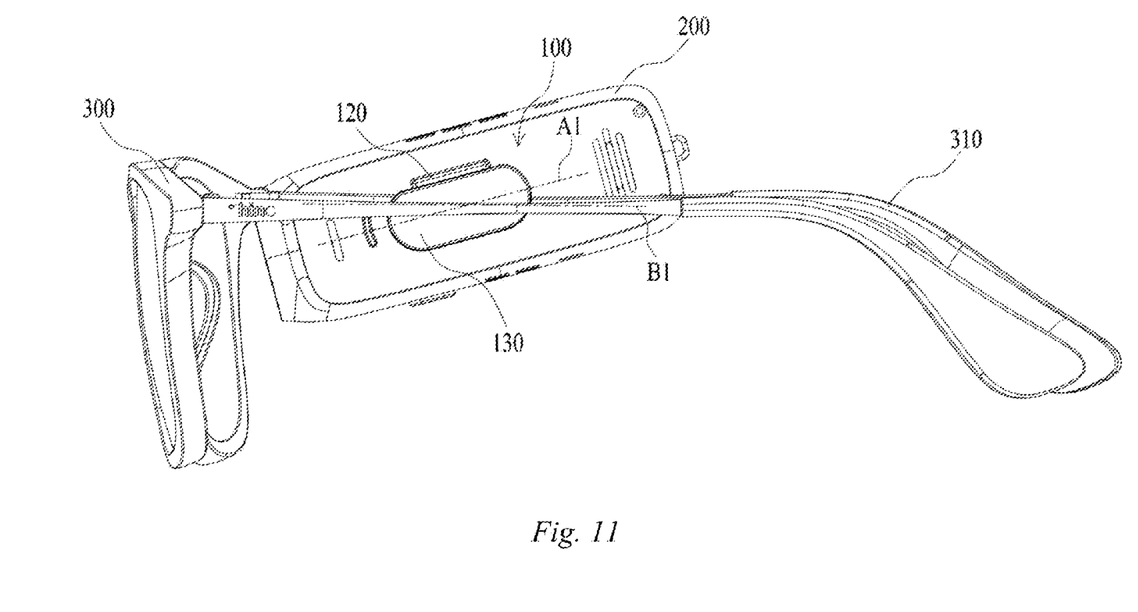
FIG. 11 is a schematic diagram of an assistive device being connected to a spectacle frame used as an example of a wearable device by means of a connector according to a third example embodiment of the present disclosure.
Figure 12:
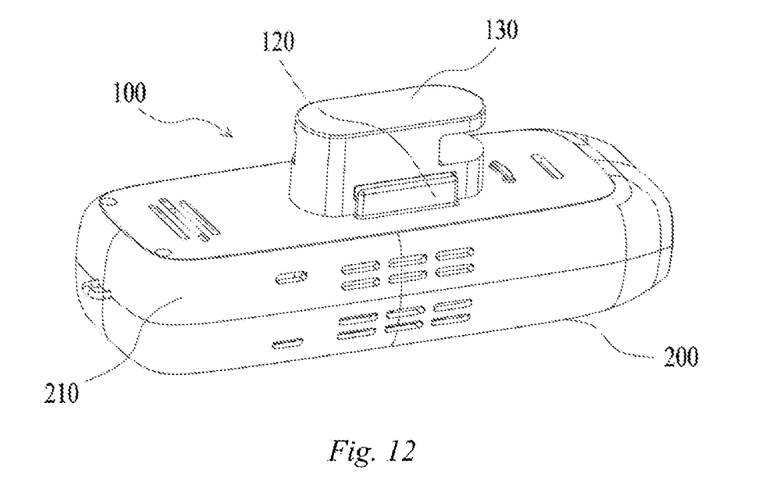
FIG. 12 is a schematic perspective view of a connector used for connecting an assistive device to a wearable device according to another example embodiment of the present disclosure, with the connector being in a state of being connected to the assistive device.
Figure 13:
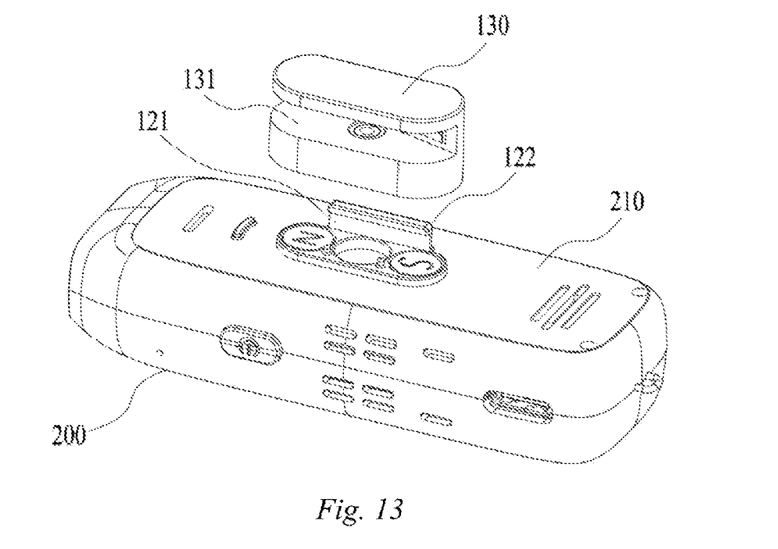
FIG. 13 is a schematic perspective view of the connector shown in FIG. 12 from another angle.
Figure 14:
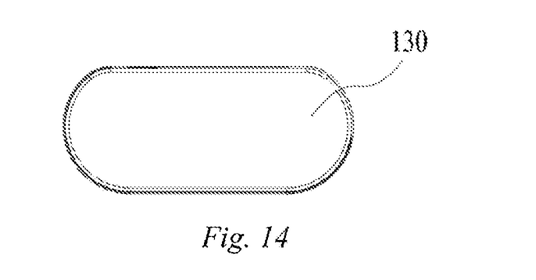
FIGS. 14 to 17 are respectively a front view, a rear view, a side view, and a top view of a second magnetic connecting component according to another example embodiment of the present disclosure.
Figure 15:
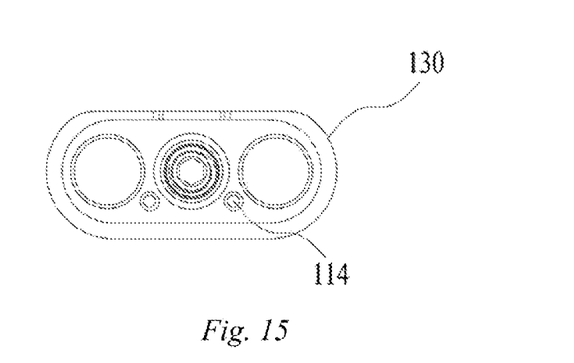
Figure 16:
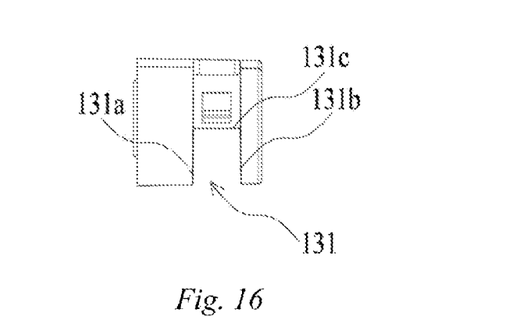
Figure 17:
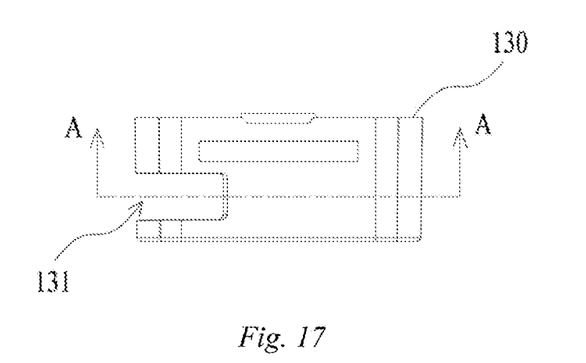
Figure 18:
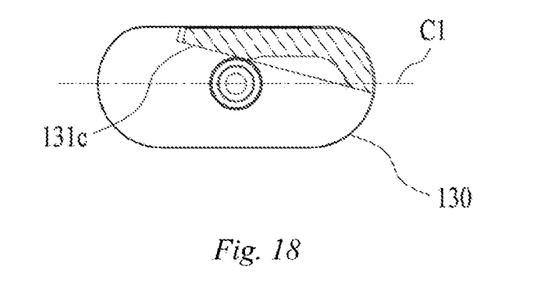
FIG. 18 is a sectional view of the second magnetic connecting component according to another example embodiment of the present disclosure along A-A in FIG. 17.

The connector 100 according to another example embodiment of the present disclosure will be described below with reference to FIGS. 11 to 18. As shown in FIG. 11, the connector 100 is configured to detachably connect the assistive device 200 to a spectacle frame 300 used as a possible example of the wearable device.

The embodiment shown in FIGS. 11 to 18 is substantially the same as the embodiment shown in FIGS. 1 to 9, and therefore the features in FIGS. 11 to 18 that are the same as or similar to those in FIGS. 1 to 9 will not be described again.

The embodiment shown in FIGS. 11 to 18 differs from the embodiment in FIGS. 1 to 9 in that the second magnetic connecting component 130 is configured such that the assistive device 200 is installed tilting downward relative to the temple of the spectacle frame 300 (see FIG. 11). That is, a longitudinal axis A1 of the assistive device 200 and a longitudinal axis B1 of the temple of the spectacle frame 300 form a predetermined tilt angle. Such downward tilting installation is particularly applicable to a reading scenario. Different from a walking scenario that requires the "line of sight" to be parallel to the direction of travel, in a reading scenario, it is desirable that the "line of sight" is tilted downward relative to the temple of the spectacle frame 300 so as to provide a better user experience. By means of the reasonable setting of the predetermined tilt angle, it is possible to significantly increase the effective image area that can be recognized by the assistive device 200, and not apply significant pressure to the spectacle frame 300. According to the present disclosure, the longitudinal axis A1 of the assistive device 200 and the longitudinal axis B1 of the temple of the spectacle frame 300 form a predetermined tilt angle of 10 degrees to 20 degrees therebetween, and the predetermined tilt angle may be in some embodiments 14 degrees, 15 degrees, and 16 degrees.

In order to install the assistive device 200 tilting downward relative to the temple of the spectacle frame 300 (see FIG. 11), according to the present disclosure, the U-shaped groove 131 of the second magnetic connecting component 130 is defined by two lateral faces 131a and 131b and a connecting face 131c connecting the two lateral faces 131a and 131b, and when the U-shaped groove 131 of the second magnetic connecting component 130 receives the temple of the spectacle frame 300, the connecting surface 131c abuts against a top surface of the temple of the spectacle frame 300. By arranging the connecting surface 131c to tilt relative to a longitudinal axis Cl, parallel to the longitudinal axis A1 of the assistive device 200, of the second magnetic connecting component 130 (see FIG. 18), the assistive device 200 is tilted relative to the temple of the spectacle frame 300 after being installed to the spectacle frame 300.

An existing assistive device with a camera is parallel to a temple of a spectacle frame after being installed. Generally, an object (for example, a magazine or other picture content) that needs to be recognized by a user is in a position slightly higher or lower than the height of glasses. Because the angle of field of view of the camera of the assistive device is vertically symmetrical, when the assistive device is installed to be parallel to the temple of the spectacle frame, a recognition area above the spectacle frame is useless and wasteful. That is, during image recognition, the utilization of the angle of field of view of the camera of the assistive device is not high. In comparison, according to the implementation described above of the present disclosure, the assistive device is tilted downward relative to the temple of the spectacle frame by a predetermined tilt angle, and when the spectacle frame is in a horizontal state, it is equivalent that the angle of field of view area of the camera of the assistive device moves downward as a whole, and at this time, the effective image area that can be recognized by the assistive device is significantly increased, thereby greatly improving the utilization of the angle of field of view. For example, when the assistive device is tilted 15 degrees downward relative to a temple of a spectacle frame, the effective image area will increase by 20%.

It should be understood that, by appropriately setting the shape of the locking component 120, the shape of the second locking groove 132 fitted with the locking component 120, etc., the second magnetic connecting component 130 can rotate relative to the first magnetic connecting component 110 by a predetermined angle. In addition, by means of setting the shape of the locking component 120, the shape of the second locking groove 132 fitted with the locking component 120, etc., the first magnetic connecting component 110 can be, relative to the second magnetic connecting component 130, in at least a first position where the first magnetic connecting component and the second magnetic connecting component form a first angle, and a second position where the first magnetic connecting component and the second magnetic connecting component form a second angle different from the first angle. As an example, the first angle may correspond to the case where the assistive device 200 is substantially parallel to the temple of the spectacle frame 300 (for example, as shown in FIG. 1) and is applicable to a scenario, such as walking, that requires "horizontal sight," and the second angle may correspond to the case where the assistive device 200 is tilted relative to the temple of the spectacle frame 300 by a predetermined angle (for example, as shown in FIG. 11) and is applicable to a scenario, such as reading, that requires downward tilting "line of sight."

It should be further understood that, in order to that the assistive device 200 is tilted relative to the temple of the spectacle frame 300 by a predetermined angle, in addition to the example implementations described above shown in FIGS. 11 to 18, according to the present disclosure, the first magnetic connecting component 110 may also be further configured such that a longitudinal axis of the first magnetic connecting component 110 and a longitudinal axis of the assistive device 200 form a predetermined tilt angle, or the second magnetic connecting component 130 is configured to form a predetermined tilt angle relative to the temple of the spectacle frame 300, in other manners including, but not limited to, providing a tilting protruding portion on the temple of the spectacle frame 300 (the temple being accommodated in the U-shaped groove 131) and directly forming the second magnetic connecting component 130 on the temple of the spectacle frame 300 by means of injection molding at a predetermined tilt angle.

Figure 19:
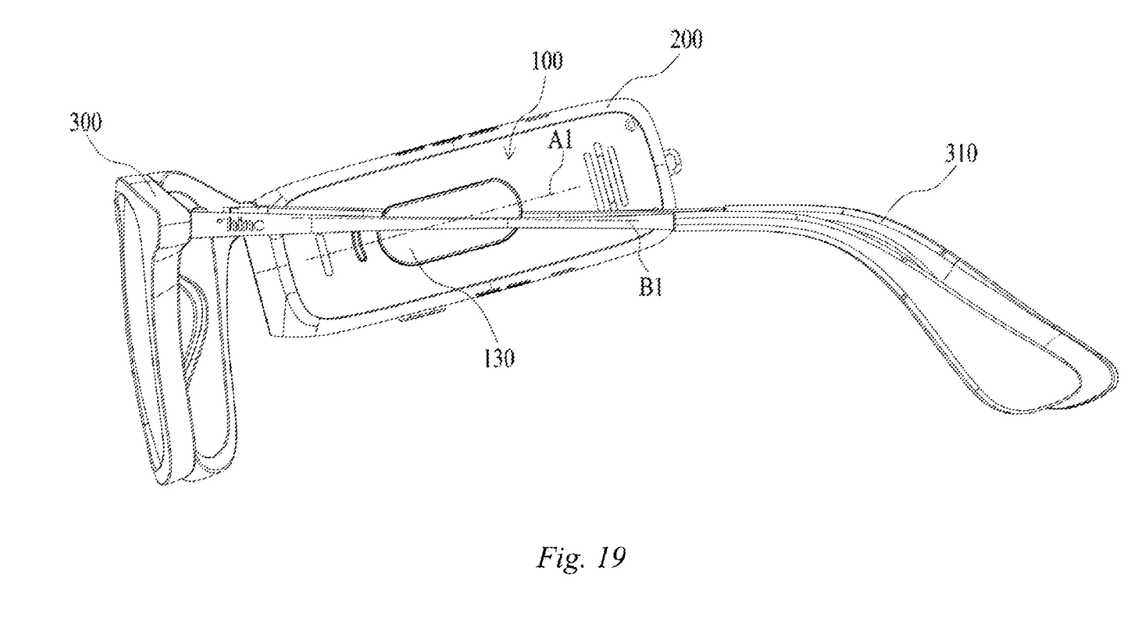
FIG. 19 shows a fourth example embodiment according to the present disclosure, which is different from the third example embodiment only in that a locking component is omitted.

It should be understood that, the connector 100 according to the third example embodiment of the present disclosure may not have the locking component 120. FIG. 19 shows a fourth example embodiment of the present disclosure, which is different from the third example embodiment only in that the locking component 120 is omitted. Since the remaining structure in the fourth example embodiment shown in FIG. 19 is identical to that in the third example embodiment shown in FIGS. 11 to 18, it will not be described herein again.

Although the embodiments or examples of the present disclosure have been described with reference to the drawings, it should be understood that the methods, systems and devices described above are merely exemplary embodiments or examples, and the scope of the present disclosure is not limited by the embodiments or examples, and is only defined by the scope of the granted claims and the equivalents thereof. Various elements in the embodiments or examples can be omitted or substituted by equivalent elements thereof. Moreover, the steps can be performed in an order different from that described in the present disclosure. Further, various elements in the embodiments or examples can be combined in various ways. It is important that, as the technology evolves, many elements described herein can be substituted by equivalent elements that appear after the present disclosure.

The invention claimed is:

1. An assistive device comprising a connector for installing the assistive device to a wearable body, the connector including:
   a first magnetic connecting component;
   a second magnetic connecting component detachably coupled to the first magnetic connecting component by magnetic attraction; and
   a locking component,
   wherein when the first magnetic connecting component and the second magnetic connecting component are coupled to each other by the magnetic attraction, the locking component is structured to prevent, by means of form-fit with the second magnetic connecting component, the second magnetic connecting component from moving relative to the first magnetic connecting component in at least one direction perpendicular to a direction of the magnetic attraction, and
   wherein the locking component only allows, by means of form-fit with the second magnetic connecting component, the second magnetic connecting component to move relative to the first magnetic connecting component within a set range in a direction parallel to a direction of magnetic attraction.

2. The assistive device according to claim 1, wherein the locking component comprises a tongue, the second magnetic connecting component comprises a locking groove structured to accommodate the tongue, and the tongue is configured to move a first distance in the locking groove in a direction parallel to the direction of the magnetic attraction.

3. The assistive device according to claim 1, wherein the second magnetic connecting component comprises a clamping groove structured to clamp a portion of the wearable body such that the second magnetic connecting component is detachably coupled to the wearable body.

4. The assistive device according to claim 3, wherein the clamping groove has a first lateral face, a second lateral face, and a connecting surface connecting the first lateral face and the second lateral face, and the connecting surface and a longitudinal axis of the second magnetic connecting component form a tilt angle.

5. The assistive device according to claim 4, wherein the tilt angle is between 10 degrees and 20 degrees.

6. The assistive device according to claim 4, wherein the tilt angle is about 15 degrees.

7. The assistive device according to claim 6, wherein a longitudinal axis of the connector and a longitudinal axis of the assistive device form an tilt angle.

8. The assistive device according to claim 1, wherein the second magnetic connecting component has a recess structured to accommodate at least a portion of the first magnetic connecting component in a form-fit manner, with a depth of the first magnetic connecting component entering the recess in the direction of magnetic attraction being less than a first distance.

9. The assistive device according to claim 8, wherein the first magnetic connecting component is provided with a beveled portion at a lateral portion thereof near the locking component, and the second magnetic connecting component is structured to move along the beveled portion in a direction away from the locking component while moving away from the first magnetic connecting component against the magnetic attraction.

10. The assistive device according to claim 1, wherein the first magnetic connecting component has at least one convex pin extending parallel to the direction of magnetic attraction, and the second magnetic connecting component has a convex pin accommodating portion for accommodating the at least one convex pin, with a depth of the convex pin entering the convex pin accommodating portion in the direction of magnetic attraction being less than a first distance.

11. The assistive device according to claim 1, wherein the first magnetic connecting component and the second magnetic connecting component comprise at least one pair of permanent magnets having opposite polarities.

12. The assistive device according to claim 1, wherein the first magnetic connecting component and the locking component are detachably coupled to the assistive device or integrated with the assistive device.

13. The assistive device according to claim 12, wherein the first magnetic connecting component is integrated with the assistive device by means of injection molding.

14. The assistive device according to claim 1, wherein the second magnetic connecting component is detachably coupled to the wearable body or integrated with the wearable body.

15. The assistive device according to claim 14, wherein the second magnetic connecting component is integrated with the wearable body by means of injection molding.

16. The assistive device according to claim 1, wherein the first magnetic connecting component is structured to rotate relative to the second magnetic connecting component by an angle.

17. The assistive device according to claim 1, wherein the first magnetic connecting component is structured to be coupled to the second magnetic connecting component at at least a first position where the first magnetic connecting component and the second magnetic connecting component form a first angle, and at a second position where the first magnetic connecting component and the second magnetic connecting component form a second angle different from the first angle.

18. A wearable device, comprising:
   a wearable body; and
   an assistive device coupled to the wearable body through a connector;
   wherein the connector includes:
      a first magnetic connecting component;
      a second magnetic connecting component detachably coupled to the first magnetic connecting component by magnetic attraction; and
      a locking component,
      wherein when the first magnetic connecting component and the second magnetic connecting component are coupled to each other by the magnetic attraction, the locking component is structured to prevent, by means of form-fit with the second magnetic connecting component, the second magnetic connecting component from moving relative to the first magnetic connecting component in at least one direction perpendicular to a direction of the magnetic attraction, and
      wherein the locking component only allows, by means of form-fit with the second magnetic connecting component, the second magnetic connecting component to move relative to the first magnetic connecting component within a set range in a direction parallel to the direction of magnetic attraction.

19. An assistive device comprising a connector for installing the assistive device to a wearable body, the connector including:
   a first magnetic connecting component; and a second magnetic connecting component detachably coupled to the first magnetic connecting component by magnetic attraction;

wherein the second magnetic connecting component includes a clamping groove structured to clamp a portion of the wearable body such that the second magnetic connecting component is detachably coupled to the wearable body, and wherein the clamping groove has a first lateral face, a second lateral face, and a connecting surface connecting the first lateral face and the second lateral face, and the connecting surface and a longitudinal axis of the second magnetic connecting component form a tilt angle.

20. The assistive device according to claim 19, wherein the first magnetic connecting component is structured to be coupled to the second magnetic connecting component at at least a first position where the first magnetic connecting component and the second magnetic connecting component form a first angle, and at a second position where the first magnetic connecting component and the second magnetic connecting component form a second angle different from the first angle.

\* \* \* \* \*